United States Patent [19]

Fujimura et al.

[11] Patent Number: 4,987,284
[45] Date of Patent: Jan. 22, 1991

[54] DOWNSTREAM MICROWAVE PLASMA PROCESSING APPARATUS HAVING AN IMPROVED COUPLING STRUCTURE BETWEEN MICROWAVE PLASMA

[75] Inventors: Shuzo Fujimura, Tokyo; Satoru Mihara, Kawasaki; Toshimasa Kisa, Kawasaki; Yasunari Motoki, Kawasaki, all of Japan

[73] Assignee: Fujitsu Limited, Kawasaki, Japan

[21] Appl. No.: 462,954

[22] Filed: Jan. 8, 1990

Related U.S. Application Data

[63] Continuation of Ser. No. 24,070, Mar. 10, 1987, abandoned.

[30] Foreign Application Priority Data

Mar. 13, 1986 [JP] Japan .............................. 61-055447

[51] Int. Cl.$^5$ .............................................. B23K 9/00
[52] U.S. Cl. ....................... 219/121.43; 219/121.4; 219/10.55 R; 219/121.42; 156/345; 204/298.23
[58] Field of Search ................. 219/121.4–121.44, 219/75, 121.59, 121.52, 10.55 R, 10.55 M; 315/111.21, 111.51; 204/192, 298 MW; 156/643, 646, 345

[56] References Cited

U.S. PATENT DOCUMENTS

| | | | |
|---|---|---|---|
| 3,879,597 | 4/1975 | Bersin et al. | 219/121 PD |
| 4,065,369 | 12/1977 | Ogawa et al. | 219/121 PG |
| 4,101,411 | 7/1978 | Suzuki et al. | 219/121 PG |
| 4,304,983 | 12/1981 | Pierfederici | 219/121 PD |
| 4,431,898 | 2/1984 | Reinberg et al. | 219/121 PG |
| 4,433,228 | 2/1984 | Nishimatsu et al. | 219/121 PG |
| 4,512,868 | 4/1985 | Fujimura et al. | 204/298 MW |
| 4,718,976 | 1/1988 | Fujimura | 204/298 MW |
| 4,741,800 | 5/1988 | Yamazaki | 204/298 MW |

FOREIGN PATENT DOCUMENTS 0183561  6/1986  European Pat. Off. ...... 219/121 PD

OTHER PUBLICATIONS

English Abstract of Japanese Patent Application 60-25234, 2-08-85.

*Primary Examiner*—M. H. Paschall
*Attorney, Agent, or Firm*—Staas & Halsey

[57] ABSTRACT

A downstream microwave plasma processing apparatus useful in fabricating an integrated circuit semiconductor device includes a waveguide, a microwave transmitting window perpendicular to a microwave electric field in the waveguide, a plasma generating chamber below the window and a reaction chamber separated from the plasma generating region by a gas-porous microwave shield. The microwave energy is transmitted into the plasma generating chamber through the microwave transmitting window, and generates a plasma which is confined therein by the shield. Radicals of a short-lived reactive gas, generated in the plasma, pass through the shield and impinge onto a workpiece placed in the reaction chamber. Uniform and effective downstream plasma etching or ashing is produced.

12 Claims, 1 Drawing Sheet

DOWNSTREAM MICROWAVE PLASMA PROCESSING APPARATUS HAVING AN IMPROVED COUPLING STRUCTURE BETWEEN MICROWAVE PLASMA

This is a continuation of copending application Ser. No. 07/024,070 filed on Mar. 10, 1987, now abandoned.

BACKGROUND OF THE INVENTION

1. Field of the Invention

The present invention relates to a downstream plasma processing apparatus used for an etching or ashing process during fabrication of an integrated circuit semiconductor (IC) device or similar such devices. More particularly, the present invention relates to a downstream plasma microwave etching apparatus having an improved coupling structure between a waveguide and a plasma generating region for providing substantially uniform etching or ashing of an IC substrate or a similar workpiece to be processed, along with stable impedance matching of the microwave circuit, and which allows uniform high rate downstream plasma processing of a semiconductor material by reducing the reflection of microwaves.

2. Description of the Related Art

A known process for forming fine patterns in an IC device employs both an etching process and an "ashing" process, i.e., a process of etching off the protective layers of silicon, silicon dioxide, or silicon nitride formed on a semiconductor substrate, and a process of stripping, or "ashing," a photoresist mask, consisting of a layer of an organic material, off the substrate.

Recently, "wet" etching, utilizing chemical solvents, has been replaced by "dry" etching which affords various advantages, such as the capability of achieving fine resolution and less undercutting of the etched pattern, elimination of wafer handling for rinsing and drying, inherent cleanliness and the like. In particular, by employing a plasma process, sequential etching and ashing operations with the same apparatus become possible, allowing implementation of a fully automated fabricating process for IC devices.

A plasma is a highly ionized gas containing nearly equal numbers of positively and negatively charged particles plus free radicals. The free radicals are electrically neutral atoms or molecules that can actively form chemical bonds with other atoms. The free radicals generated in a plasma, acting as a reactive species, chemically combine with a material to be etched, to form volatile compounds which are removed from the system by evacuation. Such plasma etching is referred to as reactive ion etching (RIE). A plasma etching apparatus includes essentially a plasma generating region, a reacting region and an evacuating device.

In a plasma etching apparatus, a plasma is generated, typically in a gas at a pressure of approximately 0.05 to 2 Torr, by applying radio-frequency, or microwave, energy to the gas. The generating efficiency of the plasma, or the level of chemical radicals contained in the plasma, is an important factor in plasma processing. Microwave plasma etching and ashing provide the advantages of high plasma density and electrodeless discharge, and are widely used for the fabrication of IC devices.

There are two basic types of plasma processing. One is the so-called "oven type" plasma processing, where a workpiece is placed in a plasma generating region and exposed to the plasma. The other type is the so-called "downstream" plasma processing where the workpiece is placed outside the plasma generating region. Generally, an IC device exposed in a plasma environment, such as in an oven, is damaged by ion bombardment, radiation of ultraviolet rays, soft X-rays, and the like, and the IC substrate should be shielded from the plasma. Therefore, downstream plasma processing is preferred for an IC substrate because it provides the needed shielding. Hereinafter, the term "plasma processing" refers only to downstream plasma processing, unless otherwise indicated.

Radicals generated in a plasma are introduced into a reaction region to react with a material to be worked, which is placed therein. Unfortunately, the radicals are believed to collide with other gas molecules or wall surfaces, resulting in recombination and loss of chemical activity. It is, therefore, very important to reduce the recombination of the radicals. Taking the above need into consideration, an improved microwave plasma etching apparatus has been developed, disclosed in U.S. Pat. No. 4,512,868, issued on Apr. 23, 1985, to S. Fujimura et al. and is incorporated by reference herein. FIG. 1 is a schematic cross-sectional view of the microwave plasma etching apparatus disclosed by the above patent. Through a waveguide 1, microwave power 2 supplied from a microwave energy source 12 is transmitted in the direction indicated by arrow A. An evacuatable processing vessel 4, including a plasma generating chamber 9 and a reaction chamber 10, is partitioned from the waveguide 1 by a dielectric window 3, such as a ceramic or a silica glass window. The plasma generating chamber 9 is effectively part of the waveguide 1. The reaction chamber 10 is spatially contiguous with the plasma generating chamber 9 and delineated therefrom by a metallic mesh 6, which defines and forms a portion of the wall of the waveguide 1. The metallic mesh 6 acts as a microwave energy shield, to prevent the plasma generated in the chamber 9 from passing into the reaction chamber 10, and thereby protects workpiece 11 which is supported on a platform or stage 5 in the reaction chamber 10. Even while shielding the microwave energy, the metallic mesh 6 permits the radicals generated in the plasma to pass into the reaction chamber 10.

The successive processing steps are as follows. The processing vessel 4, including the plasma generating chamber 9 and the reaction chamber 10, is evacuated by a pumping device (not shown) through exhaust tubes 7. A reactive gas is introduced into the plasma generating chamber 9, through a gas supply tube 8, and is ionized by the microwaves 2 to form a plasma. Radicals generated in the plasma pass through the metallic mesh 6 and reach the object 11, such as a semiconductor substrate mounted on the stage 5, and react with the object 11, producing volatile compounds which are exhausted by the pumping device. Thus, the plasma processing operation is carried out in the reaction chamber 10 downstream of the plasma. Accordingly, the above-described plasma processing is referred to as downstream plasma processing. The distance between the plasma generating chamber 9 and the object 11 may be as small as approximately 8 mm, for example. This short distance permits radicals to survive transmission from the plasma generating chamber 9 to the reaction chamber 10. As a result, the workpiece 11 is processed effectively and a relatively high plasma processing rate is attained.

As can be seen from FIG. 1, the dielectric window 3 is disposed in a direction perpendicular to the direction A in which the microwaves 2 are transmitted or propagated. In other words, the window 3 is disposed parallel to the electric field of the microwaves 2. In this configuration the microwaves 2 are partially reflected by two boundary layers or sharp transitions of the dielectric constant, in the transmitting direction A of the microwaves 2. The first transition occurs at the interface between the air space within the waveguide 1 and the dielectric window 3, and the second occurs at the interface between the dielectric window 3 and the plasma generating chamber 9 which is a vacuum space or a plasma-filled space, depending on the processing step. In addition, the electrical impedance of the plasma generating chamber 9 varies substantially depending on the absence or presence of the plasma therein. This imposes a serious obstacle to proper impedance matching of the relevant microwave circuit for all conditions in the plasma generating chamber 9. If the impedance is matched while the plasma generating chamber 9 is maintained in a vacuum, i.e., is evacuated, there will be a mismatched impedance during and after the generation of the plasma in the chamber 9, because reflection of the microwaves 2 is substantially increased upon the generation of the plasma. In one test of the apparatus illustrated in FIG. 1, oxygen was employed as the reactive gas at a pressure of 1 Torr. In this test, 70% of the microwaves 2 were reflected without matching and 30% with matching. Mismatching of the impedance in the microwave circuit may result in a poor production of plasma, and sudden and large reflection of microwave energy which can damage the apparatus.

Another problem is the decay of the microwaves in the plasma generating chamber 9. The microwave electrical energy 2 is consumed in ionizing the reactive plasma gas molecules when introduced into the plasma generating chamber 9, and decays rapidly. Consequently, the intensity of the microwave electric field 2 drops rapidly as the microwaves 2 progress in the direction A in the plasma generating chamber 9; as a result, the distribution of plasma density P drops rapidly, as shown by line Pd of FIG. 1.

When long life radicals, such as fluoride radicals generated from carbon tetrafluoride ($CF_4$) gas, are utilized, the radicals reach the workpiece 11 substantially uniformly, because the radicals are capable of surviving until reaching the workpiece 11 despite repeated collisions with other particles and vessel walls and resultant changes in direction. However, with respect to short life radicals, such as oxygen radicals which are utilized for ashing a photoresist layer, the radicals capable of reaching the object are limited substantially to those which, when generated, were directed towards the workpiece 11. As a result, the rate of plasma processing of the workpiece 11 is not uniform with a distribution similar to that of the generation of the radicals in the plasma. Thus, uniform plasma processing of a workpiece 11, particularly one having a wide area such as a photoresist layer coated on a large size silicon wafer, is very difficult.

Several methods have been proposed to solve the above-described problem. For example, in an ashing process for removing a photoresist layer disposed on a semiconductor substrate 11, a difference is produced between the respective pressures of the reactive gas, namely oxygen gas, in the plasma generating chamber 9 and the gas in the reaction chamber 10, to provide a uniform generation of radicals in the plasma generating chamber 9. However, the elevation of oxygen gas pressure in the plasma generating chamber 9 induces further, frequent collisions between the oxygen radicals and oxygen gas molecules, reducing the active life of the radicals producing a poor ashing rate, in practice. It is also possible to add carbon tetrafluoride gas ($CF_4$) to the oxygen ($O_2$) gas to extend the active life of the oxygen radicals. In this method fluoride radicals are also generated, which damage the circuits and layers on the substrate.

In addition to the problems discussed above, a similar problem is caused by the rapid decay of the microwave energy during its transmission through the plasma. To overcome this problem, an improved configuration of the waveguide has been disclosed in Japanese Laid Open Pat. application No. 61-131454 of S. Fujimura et al., provisionally published on June 11, 1986 which corresponds to U.S. Pat. application Ser. No. 802,332, filed Nov. 28, 1985. The '454 published patent application discloses a processing vessel with a waveguide having a dielectric material microwave transmission window disposed perpendicular to the microwave electric field in the waveguide. In this configuration, the mode of the microwave transmission from the waveguide to the reaction chamber (i.e., a reactor) is not adversely affected, and the microwave energy is effectively absorbed in the plasma. However, the apparatus disclosed in the '454 published patent application is an "oven type" plasma processing apparatus, and is essentially different from a downstream plasma processing apparatus in which a workpiece is placed outside the plasma and processed by transported radicals. Therefore, to overcome the above-described problems of nonuniform and instable plasma processing, a further improved downstream plasma processing apparatus for semiconductor fabrication is desired.

SUMMARY OF THE INVENTION

It is an object of the present invention to provide an improved microwave plasma processing apparatus for fabricating integrated circuit semiconductor devices and similar such devices.

It is another object of the present invention to provide a downstream microwave plasma processing apparatus producing improved coupling of microwave energy to the plasma, thereby providing stable impedance matching of the relevant microwave circuit, and uniform plasma etching or ashing of an object being processed.

The above objects can be attained by an apparatus which has a plasma generation chamber separate from a waveguide and offset perpendicularly from a propagation direction of the microwave energy in the waveguide. The plasma generating chamber is defined by a microwave transmitting window and a shielding member. The microwave electric field in the waveguide formed perpendicular to the microwave transmitting window, is transmitted through the window into the plasma generating chamber and confined therein by the shielding member. After evacuation of the processing vessel, a reactive gas is fed into the plasma generating chamber, and the gas is ionized by the microwave energy to form a plasma. Radicals generated in the plasma pass through the shielding member and directly impinge on and react with surface material of the workpiece, such as a semiconductor substrate placed in the reaction chamber. In other words, the object is subjected to downstream plasma processing. Thus, the distance travelled by the radicals is very short. Therefore, radicals having a short life, such as oxygen radicals, can be used as a reactive species.

With the above described configuration of the plasma processing apparatus, the microwaves pass above the microwave transmitting window without substantial decay because the waveguide contains an air space which provides a fairly uniform characteristic impedance. Thus, reflection and loss of the microwave energy in the propagation direction is relatively small, resulting in a fairly uniform distribution density of the plasma across the plasma generating chamber. As a result, the distribution of radicals impinging on the surface of the workpiece, i.e., substrate, is uniform, allowing effective and uniform plasma processing of a large object using a reactive gas with a short life. In addition, the fine patterns formed on the surface of the workpiece, such as an IC substrate, are protected from damage by the plasma. The change in the impedance load of the waveguide is fairly small regardless of the presence or the absence of a plasma in the plasma generating chamber. Accordingly, impedance matching of the microwave electric circuit including the waveguide, is much easier compared to the prior art. Particularly, the initiation or ignition of the plasma becomes very easy and stable.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENT

Figure 1:
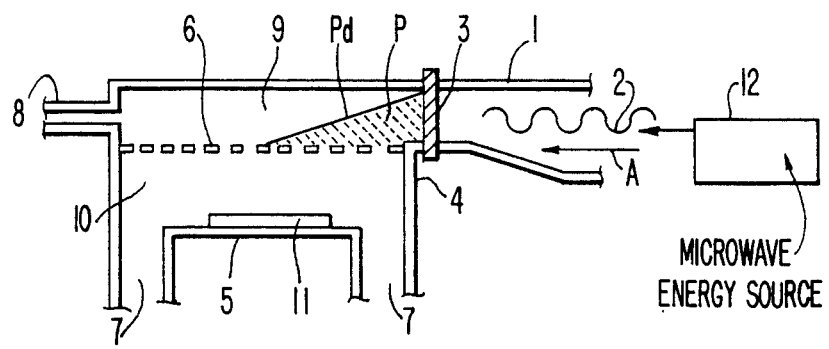
FIG. 1 is a schematic cross-sectional side view of a prior art microwave plasma processing apparatus having a waveguide electrically coupled to and integral with a plasma generating chamber which is disposed adjacent to a reaction chamber.
Figure 2:
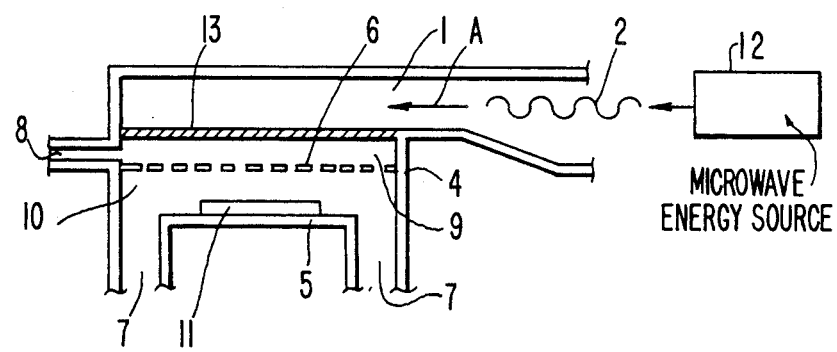
FIG. 2 is a schematic cross-sectional side view of a microwave plasma processing apparatus according to the present invention.

FIG. 2 is a schematic cross-sectional side view of an improved plasma processing apparatus which is a typical embodiment of the present invention. Microwaves 2, generated in a microwave power source 12 with a predetermined frequency, are transmitted in a direction A as indicated by an arrow. A microwave transmitting window 13, made of a silica or ceramic material, is disposed perpendicular to the microwave electric field 2. That is, the main plane or major axes of the window 13, is disposed in parallel with the propagation direction A. The plasma processing apparatus according to the present invention is thereby clearly different from the prior art device illustrated in FIG. 1. In comparison with the apparatus disclosed in U.S. Pat. application No. 802,332, the plasma processing apparatus of the present invention provides the advantages of downstream plasma processing, while the '332 apparatus is an "oven type" plasma processing apparatus.

The construction of an apparatus according to the present invention is essentially the same as that of FIG. 1 except for the arrangement of the waveguide 1, window 13 and plasma generating chamber 9. A processing vessel 4 is attached to the waveguide 1 and separated therefrom by the microwave transmission window 13. A plasma generating chamber 9 and a reaction chamber 10 are formed in the processing vessel 4, by electrically separating, but spatially adjoining both chambers with a gas-porous metallic shield 6. The gas-porous metallic shield 6 may be a metallic mesh, as in the prior art., or a perforated metallic plate with a structure similar to a shower head with a plurality of holes to allow the passage of the radicals while shielding the reaction chamber 10 from the microwaves 2. Accordingly, the plasma generating chamber 9 is effectively a part of the waveguide 1, but diametrically offset therefrom. A platform or stage 5, reciprocably moveable in a direction perpendicular to the shield 6, is disposed inside the reaction chamber 10, and a workpiece 11 to be processed is mounted on the stage 5, facing the shield 6. The microwave transmission window 13, the gas-porous metallic shield 6, and the stage 5, are disposed approximately in parallel with each other. The distance between the window 13 and the shield 6, is preferably between 3 mm and 5 mm, and that between the shield 6 and the stage 5, preferably ranges from 5 mm to 20 mm. The latter distance is selected depending on the desired plasma ashing rate and the ease of setting the workpiece 11 in position on the stage 5. The window 13 should be formed to have an area or size large enough to cover the whole of any workpiece 11 to be processed to produce the best process.

An example of a plasma ashing process employing an apparatus according to the present invention, will now be described with respect to stripping a photoresist layer of novolak resin (a product of TOKYO OHKA LTD, model OFPR-800) from a semiconductor substrate. A 1.5 Kw microwave energy source is used to generate microwaves having a frequency of 2.45 GHz. Oxygen ($O_2$) gas is introduced as a plasma reacting gas into the plasma generating chamber 9, and evacuated through tubes 7 to a pressure ranging from 0.05 to 2 Torr. The process is then carried out in a similar manner to that employed in the prior art plasma processing apparatus illustrated in FIG. 1.

Under the above conditions, the distribution of the plasma density in the plasma generating chamber 9, is fairly uniform, causing the generation of uniformly distributed oxygen radicals in the plasma, which impinge on and react with the photoresist layer which covers the semiconductor substrate 11. Thus, a fairly uniform ashing of the photoresist layer is realized, resulting in a much improved ashing process. The selectivity of the plasma processing, namely, the ratio of etching rate of the photoresist film to that of silicon (Si) or that of silicon dioxide ($SiO_2$), is almost infinite, while it has a maximum of 200 when the prior art plasma processing apparatus of FIG. 1 is employed. The ashing rate is increased to 2000 Å/min. when the distance between the metallic mesh 6 and the stage 5 is 20 mm, and to 6000 Å/min. for a distance of 5 mm. In the prior art apparatus of FIG. 1, the rate is approximately 100 Å/min. All of the above data is based on a gas pressure of 0.5 Torr.

As described above, by employing a plasma processing apparatus according to the present invention, the use of short lived radicals, such as oxygen radicals, is practical in an ashing process for stripping photoresist films from a substrate, providing uniform ashing at a high ashing rate. Further, impedance matching of the relevant microwave circuit is much simpler compared to prior art downstream plasma processing, due to much greater stability in the impedance of the waveguide 2.

The many features and advantages of the present invention are apparent from the detailed specification, and thus, it is intended by the appended claims to cover all such features and advantages of the device which fall within the true spirit and scope of the invention. Further, since numerous modifications and changes will readily occur to those skilled in the art, it is not desired to limit the invention to the exact construction and operation illustrated and described. Accordingly, all suitable modifications and equivalents may be resorted to falling within the scope and spirit of the invention.

What is claimed is:

1. A plasma processing apparatus receiving microwave energy and processing a workpiece, comprising:
    a reaction gas source for supplying reaction gas;
    a waveguide substantially shaped as a rectangular tube, having a longitudinal axis and side-walls extending in parallel with the longitudinal axis of said waveguide, for receiving the microwave energy propagating in a first direction parallel to the walls of and transferring the microwave energy along the longitudinal axis of said waveguide;
    a dielectric window formed in one of the side-walls of said waveguide for transmitting the microwave energy therethrough to an exterior surface thereof;
    a plasma generating chamber, formed adjacent to the one of the side-walls of said waveguide to entirely enclose the exterior surface of said dielectric window, said plasma generating chamber offset on the exterior of said waveguide from the one of the side-walls of said waveguide in a direction perpendicular to the longitudinal axis of said waveguide and connected to said reaction gas source, said plasma generating chamber receiving the microwave energy transmitted through said dielectric window and the reaction gas supplied from said reaction gas source and generating a plasma, containing chemical radicals and ions, within said plasma generating chamber;
    a reaction chamber coupled to said plasma generating chamber, having a perforated metal plate separating said reaction chamber from said plasma generating chamber, the perforated metal plate formed substantially in parallel with said dielectric window, said reaction chamber receiving the chemical radicals from said plasma generating chamber through the perforated metal plate and protected from the ions by the perforated metal plate; and
    a holding stage for mounting the workpiece thereon, said holding stage disposed in said reaction chamber with a top surface of said holding stage substantially in parallel with the perforated metal sheet and reciprocally movable in a direction perpendicular to the perforated metal plate.

2. A plasma processing apparatus, receiving microwaves from a microwave energy source, for processing a workpiece, said plasma processing apparatus comprising:
    a waveguide, having walls, for transmitting the microwaves in a propagation direction along said waveguide parallel to the walls;
    a microwave transmitting window in one of the walls, disposed parallel to the propagation direction of adjacent microwaves, said microwave transmitting window preventing passage of gas therethrough while permitting microwave energy to be transmitted therethrough without changing the propagation direction;
    gas supply means for supplying a reactive gas;
    a vacuum processing vessel, coupled to said gas supply means to receive the reactive gas and having one side coupled to said waveguide by said microwave transmitting window;
    vacuum generating means, coupled to said vacuum processing vessel, for generating a partial vacuum therein;
    support means for supporting the workpiece within said vacuum processing vessel; and
    a shield, disposed between said support means and said microwave transmitting window and separating said processing vessel into a reaction chamber containing said support means and a plasma generating chamber bounded on a side opposite said shield by said microwave transmitting window, said gas supply means supplying the reactive gas to the plasma generating chamber to form a plasma when microwave energy is received, said shield member being gas porous and permitting at least a portion of the reactive gas to pass into said reaction chamber, while containing the plasma generating chamber.

3. A plasma processing apparatus as recited in claim 2, wherein said shield is a metal member, substantially parallel to said microwave transmitting window, having a plurality of openings to permit at least the portion of the reactive gas to pass from the plasma generating chamber to the reaction chamber.

4. A plasma processing apparatus as recited in claim 3, wherein said shield comprises a metallic mesh.

5. A plasma processing apparatus as recited in claim 3, wherein said shield comprises a perforated metallic plate.

6. A plasma processing apparatus as recited in claim 2, wherein said microwave transmitting window comprises a dielectric material.

7. A plasma processing apparatus as recited in claim 6, wherein said dielectric material comprises silica.

8. A plasma processing apparatus as recited in claim 6, wherein said dielectric material comprises a ceramic material.

9. A plasma processing apparatus as recited in claim 2, wherein the reactive gas supplied by said gas supply means includes oxygen.

10. A plasma processing apparatus as recited in claim 2, wherein said support means comprises a stage reciprocably movable in a direction substantially perpendicular to said shield.

11. A plasma processing apparatus according to claim 2, wherein the workpiece and said microwave transmitting window each have a length measured substantially parallel to the propagation direction and a width measured substantially perpendicular to both the propagation direction and the microwave electric field, the length and width of the workpiece being respectively smaller than the length and width of said microwave transmitting window.

12. A plasma processing apparatus as recited in claim 2, wherein said vacuum processing vessel includes an evacuation outlet disposed opposite said shield, and gas in said vacuum processing vessel is evacuated through said evacuation outlet.

* * * * *